(12) United States Patent
Zhao

(10) Patent No.: US 9,716,509 B2
(45) Date of Patent: Jul. 25, 2017

(54) DIGITAL MEASUREMENT OF DAC SWITCHING MISMATCH ERROR

(71) Applicant: Analog Devices, Inc., Norwood, MA (US)

(72) Inventor: Jialin Zhao, Santa Clara, CA (US)

(73) Assignee: ANALOG DEVICES, INC., Norwood, MA (US)

(*) Notice: Subject to any disclaimer, the term of this patent is extended or adjusted under 35 U.S.C. 154(b) by 0 days.

(21) Appl. No.: 15/360,617

(22) Filed: Nov. 23, 2016

(65) Prior Publication Data

US 2017/0170840 A1    Jun. 15, 2017

Related U.S. Application Data

(60) Provisional application No. 62/267,613, filed on Dec. 15, 2015.

(51) Int. Cl.
*H03M 1/10* (2006.01)
*H03M 3/00* (2006.01)
*H03M 1/12* (2006.01)

(52) U.S. Cl.
CPC ....... *H03M 1/1071* (2013.01); *H03M 1/1245* (2013.01); *H03M 3/378* (2013.01); *H03M 3/422* (2013.01); *H03M 3/464* (2013.01)

(58) Field of Classification Search
CPC .. H03M 1/1071; H03M 1/1245; H03M 3/422; H03M 3/464
USPC .......................... 341/155, 144, 143, 120, 118
See application file for complete search history.

(56) References Cited

U.S. PATENT DOCUMENTS

| | | |
|---|---|---|
| 4,996,530 A | 2/1991 | Hilton |
| 6,930,626 B2 | 8/2005 | Brooks et al. |
| 7,983,320 B2 | 7/2011 | Fullerton et al. |
| 8,031,098 B1 | 10/2011 | Ebner et al. |
| 9,543,974 B1* | 1/2017 | Yang .................... H03M 1/066 |
| 2004/0156432 A1* | 8/2004 | Hidaka ............. H04L 25/03057 375/233 |

FOREIGN PATENT DOCUMENTS

EP    2930849    10/2015

OTHER PUBLICATIONS

Muhammed Bolatkale et al., *A 4GHz CT ΔΣ ADC with 70dB DR and -74dBFS THD in 125MHz BW*, ISSCC 2011 / Session 27 / Oversampling Converters / 27.1, 2011 IEEE International Solid-State Circuits Conference, 978-1-61284-302-5/11 © 2011 IEEE, 3 pages.

(Continued)

*Primary Examiner* — Peguy Jean Pierre
(74) *Attorney, Agent, or Firm* — Patent Capital Group

(57) ABSTRACT

For analog-to-digital converters (ADCs) which utilize a feedback digital-to-analog converter (DAC) for conversion, the final analog output can be affected or distorted by errors of the feedback DAC. A digital measurement technique can be implemented to determine switching mismatch error for the feedback DAC in a continuous-time delta-sigma modulator (CTDSM) or in a continuous-time pipeline modulator. The methodology forces each DAC unit elements (UEs) to switch a certain amount times and then use the modulator itself to measure the errors caused by those switching activities respectively. The obtained errors can be stored in a look-up table and fully corrected in digital domain or analog domain.

20 Claims, 5 Drawing Sheets

(56) References Cited

OTHER PUBLICATIONS

Hajime Shibata et al., *A DC-to-1 GHz Tunable RF ΔΣ ADC Achieving DR= 74 dB and BW= 150 MHz at f0= 450 MHz Using 550 mW*, © 2012 IEEE, 10 pages.
Yunzhi Dong et al., *A 235mW CT 0-3 MASH ADC Achieving -167dBFS/Hz NSD with 53MHz BW*, ISSCC 2014 / Session 29 / Data Converters for Wireless Systems / 29.2, © 2014 IEEE International Solid-State Circuits Conference, 3 pages.
Do-Yeon Yoon et al., *An 85dB-DR 74.6dB-SNDR 50MHz-BW CT MASH ΔΣ Modulator in 28nm CMOS*, ISSCC 2015 / Session 15 / Data-Converter Techniques / 15.1, 2015 IEEE International Solid State Circuits Conference © 2015 IEEE, 3 pages.
John G. Kauffman et al., *An 8.5 mW Continuous-Time ΔΣ Modulator with 25 MHz Bandwidth Using Digital Background DAC Linearization to Achieve 63.5 dB SNDR and 81 dB SFDR*, IEEE Journal of Solid-State Circuits, vol. 46, No. 12, Dec. 2011, 13 pages.
Susan Luschas et al., *High Speed ΣΔ Modulators with Reduced Timing Jitter Sensitivity*, IEEE Transactions on Circuits and Systems—II: Analog and Digital Signal Processing, vol. 49, No. 11, Nov. 2002, 9 pages.
Yongjian Tang et al., *A 14 bit 200 MS/s DAC with SFDR >78 dBc, IM3 < -83 dBc and NSD < -163 dBm/Hz Across the Whole Nyquist Band Enabled by Dynamic-Mismatch Mapping*, IEEE Journal of Solid-State Circuits, vol. 46, No. 6, Jun. 2011, 11 pages.
Hans Van de Vel et al., *A 240mW 16b 3.2GS/s DAC in 65nm CMOS with <-80dBc IM3 up to 600MHz*, ISSCC 2014 / Session 11 / Data Converter Techniques / 11.7, 3 pages.
Benjamin Jankunas, *Design and Calibration of a 12-Bit Current-Steering DAC Using Data-Interleaving*, A Thesis presented to Graduate Supervisory Committee, Arizona State University, Dec. 2014, 71 pages.
Craig Petrie et al., *A Background Calibration Technique for Multibit Delta-Sigma Modulators*, ISCAS 2000—IEEE International Symposium on Circuits and Systems, May 28-31, 2000, Geneva, Switzerland, 4 pages.
Pascal Witte et al., *A Background DAC Error Estimation in Sigma-Delta ADCs Using a Pseudo Random Noise Based Correlation Technique*, 978-1-4244-3828-0 © 2009 IEEE, 4 pages.
Pascal Witte et al., *Background DAC Error Estimation Using a Psuedo Random Noise Based Correlation Technique for Sigma-Delta Analog-to-Digital Converters*, IEEE Transactions on Circuits and Systems—I: Regular Papers, vol. 57, No. 7, Jul. 2010, 13 pages.
John G. Kauffman et al., *An 8mW 50MS/s CT ΔΣ Modulator with 81dB SFDR and DigitalBackground DAC Linearization*, ISSCC 2011 / Session 27 / Oversampling Converters / 27.2, 3 pages.
Pascal Witte et al., *A Correlation-Based Background Error Estimation Technique for Bandpass Delta-Sigma ADC DACs*, IEEE Transactions on Circuits and Systems-II: Express Briefs, vol. 58, No. 11, Nov. 2011, 5 pages.
Pascal Witte et al., *An Error Estimation Technique for Lowpass and Bandpass ΔΣ Feedback DACs Using a Residual Test Signal*, 978-1-4673-0219-7/12 © 2012 IEEE, 4 pages.
Notice of Allowance (1st Action) issued in U.S. Appl. No. 15/360,349 mailed Mar. 8, 2017.
EP Search Report issued in EP Patent Application Serial No. 16203251.0 mailed May 15, 2017, 10 pages.

\* cited by examiner

DIGITAL MEASUREMENT OF DAC SWITCHING MISMATCH ERROR

PRIORITY DATA

This is a non-provisional patent application receiving benefit from U.S. Provisional Patent Application, entitled, DIGITAL MEASUREMENT OF DAC SWITCHING MISMATCH ERROR (filed on Dec. 15, 2015, Ser. No. 62/267,613). The U.S. Provisional Patent Application is hereby incorporated by reference in its entirety.

TECHNICAL FIELD OF THE DISCLOSURE

The present disclosure relates generally to analog-to-digital converters (ADCs) and, more particularly, to digital measurement of digital-to-analog converter switching mismatch error in a delta sigma modulator or pipeline modulator.

BACKGROUND

In many electronics applications, an analog input signal is converted to a digital output signal (e.g., for further digital signal processing). For instance, in precision measurement systems, electronics are provided with one or more sensors to make measurements, and these sensors may generate an analog signal. The analog signal would then be provided to an ADC as input to generate a digital output signal for further processing. In another instance, an antenna generates an analog signal based on the electromagnetic waves carrying information/signals in the air. The analog signal generated by the antenna is then provided as input to an ADC to generate a digital output signal for further processing.

ADCs can be found in many places such as broadband communication systems, audio systems, receiver systems, etc. ADCs can translate analog electrical signals representing real-world phenomena, e.g., light, sound, temperature or pressure for data processing purposes. ADCs are used in a broad range of applications including Communications, Energy, Healthcare, Instrumentation and Measurement, Motor and Power Control, Industrial Automation and Aerospace/Defense. Designing an ADC is a non-trivial task because each application may have different needs in speed, performance, power, cost and size. As the applications needing ADCs grow, the need for accurate and reliable conversion performance also grows.

BRIEF DESCRIPTION OF THE DRAWINGS

To provide a more complete understanding of the present disclosure and features and advantages thereof, reference is made to the following description, taken in conjunction with the accompanying figures, wherein like reference numerals represent like parts, in which.

DESCRIPTION OF EXAMPLE EMBODIMENTS OF THE DISCLOSURE

For analog-to-digital converters (ADCs) which utilize a feedback digital-to-analog converter (DAC) for conversion, the final analog output can be affected or distorted by errors of the feedback DAC. A digital measurement technique can be implemented to determine switching mismatch error for the feedback DAC in a (continuous-time) delta-sigma modulator (CTDSM) or in a (continuous-time) pipeline modulator. The methodology forces each DAC unit elements (UEs) to switch a certain amount times and then use the modulator itself to measure the errors caused by those switching activities respectively. The obtained errors can be stored in a look-up table. The obtained errors can be fully corrected in digital domain or analog domain.

Design Considerations for Analog-to-Digital Converters: Error from Feedback DAC

ADCs are electronic devices that convert a continuous physical quantity carried by an analog signal to a digital number that represents the quantity's amplitude (or to a digital signal carrying that digital number). The conversion involves quantization of the analog input signal, so it would introduce a small amount of error. Typically the quantization occurs through periodic sampling of the analog input signal. The result is a sequence of digital values (i.e., a digital signal) that has converted a continuous-time and continuous-amplitude analog input signal to a discrete-time and discrete-amplitude digital signal. An ADC can be defined by the following application requirements: its bandwidth (the range of frequencies of analog signals it can properly convert to a digital signal) and its resolution (the number of discrete levels the maximum analog signal can be divided into and represented in the digital signal). An ADC also has various specifications for quantifying ADC dynamic performance, including signal-to-noise-and-distortion ratio (SINAD), effective number of bits (ENOB), signal to noise ratio (SNR), total harmonic distortion (THD), total harmonic distortion plus noise (THD+N), and spurious free dynamic range (SFDR). ADCs have many different designs, which can be chosen based on the application requirements and performance specifications.

Figure 1:
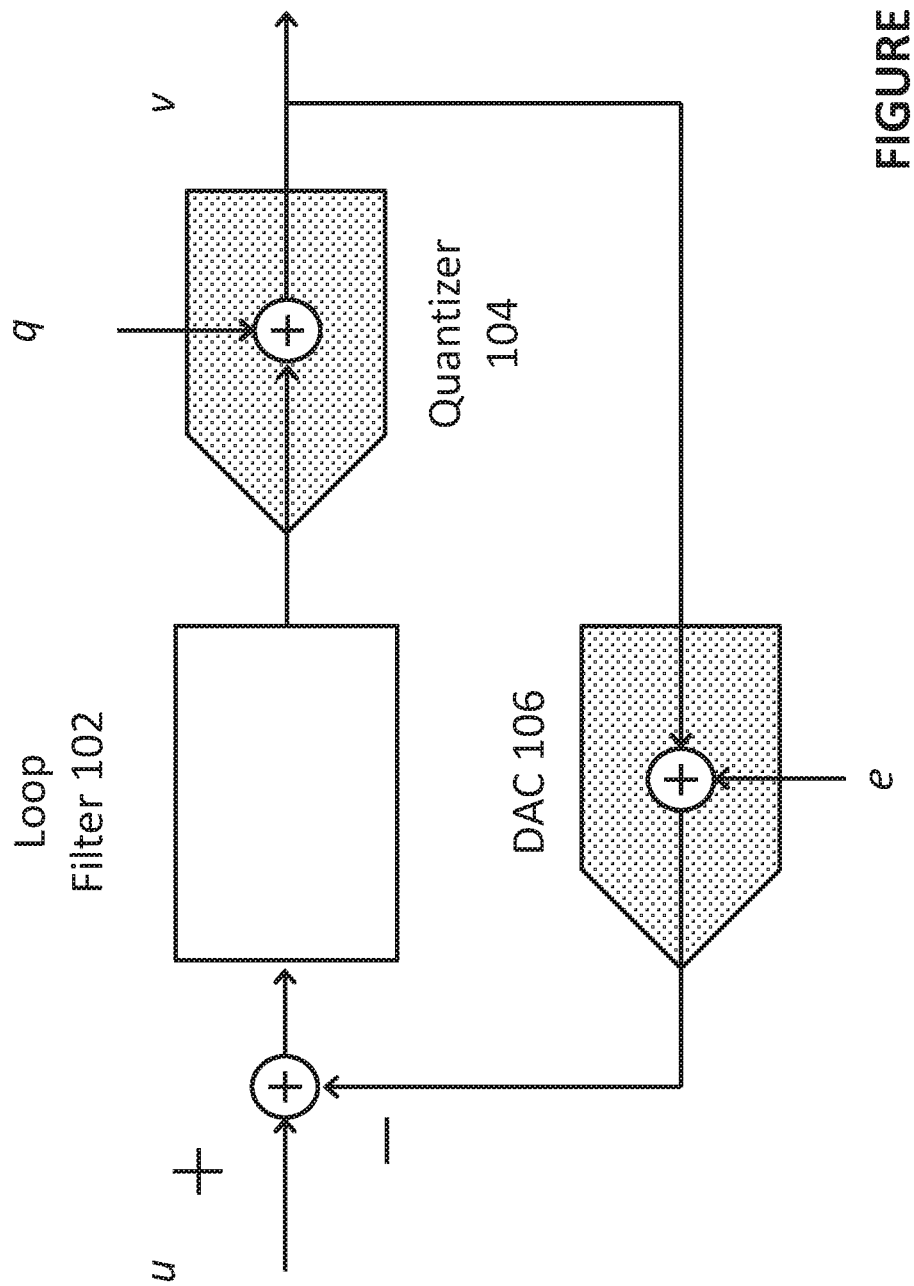
FIG. 1 is an illustrative system diagram of a delta sigma analog-to-digital converter (DS ADC)

ADCs based on delta-sigma (DS) modulation (referred to herein as "DS ADCs") have been widely used in digital audio and high precision instrumentation systems. FIG. 1 is an illustrative system diagram of a delta sigma analog-to-digital converter (DS ADC), or sometimes referred herein as a delta sigma modulator. The DS ADC includes loop filter 102, quantizer 104, and feedback digital-to-analog converter (DAC) 106 (i.e., a DAC in the feedback path of the DS ADC).

A DS ADC usually provides the advantage of being able to convert an analog input signal to a digital signal with high resolution at low cost. Typically, a DS ADC encodes an analog signal u using a DS modulator. Quantizer 104 can be used for this purpose, employing, e.g., a low resolution ADC, as a 1-bit ADC, Flash ADC, Flash quantizer, etc. Then, if applicable, the DS ADC can apply a digital filter (not shown) to the output of the DS modulator (i.e., Quantizer 104) to form a higher-resolution digital output. Loop filter 102, having one or more integrators, may be included to provide error feedback for the DS ADC and to help shape the noise from the quantizer 104 out of baseband to higher frequencies. The error is usually generated by taking the difference between the original analog input signal u and a reconstructed version of the original analog input signal generated using the feedback DAC 106 (where digitized signal v is converted back into an analog signal). One key characteristic of a DS ADC is its ability to push the quantization noise q (from quantizer 104) to higher frequencies, also referred to as noise shaping. The amount of noise shaping depends on the order of the loop filter 102. As a result, DS ADCs are generally able to achieve high resolution analog-to-digital conversion. Due to its popularity, many variations on the DS ADC and structures employing the DS ADC have been proposed.

The feedback DAC 106 is typically in a feedback configuration with an analog-to-digital converter (ADC). That is, the digital output of the ADC "v" is fed to the input of the feedback DAC 106, and the output of the feedback DAC is fed back to the input path of the ADC. Generally speaking, the feedback DAC 106 is a multi-bit DAC which is implemented with a plurality of unit elements that are controlled by input bits to the feedback DAC. Each one of the unit elements, e.g., current steering cells, generate from the input digital code v fed to the feedback DAC 106 a part of analog output signal of the feedback DAC. In some cases, these unit elements are referred to as DAC elements which make up the feedback DAC 106. The DAC elements are, in some cases, referred to as unit elements because to the current steering circuits are ideally steering the same amount of current to the output (i.e., the DAC elements are weighted the same or have the same weight).

Different variations on the DS ADC have been proposed to achieve various advantages suitable for a variety of systems. In some applications, DS ADCs have been adapted to meet power concerns, while some other DS ADCs have been adapted to reduce complexity. In some cases, DS ADCs have been adapted to meet precision concerns by providing increased control over errors and/or noise. For example, for applications with an emphasis on noise shaping, a higher order DS modulator may be used, i.e., more integrators and feedback paths are used in the loop filter for shaping even more of the quantization noise to high frequencies. Delta-sigma ADCs (e.g., FIG. 1) use the shaping of quantization noise combined with oversampling to trade off resolution with signal bandwidth. High-order noise shaping and multi-bit implementations allow for more aggressive tradeoffs, but at the risk of making the ADC unstable.

Multi-stage noise shaping (MASH) ADCs having multiple DS ADCs have been introduced. Generally speaking, MASH ADCs has a plurality of stages, e.g., a plurality of DS ADCs. In one example, a MASH ADC can have two stages, e.g., a front end and a back end. Each of the stages receive a respective analog input and outputs a respective digital output. In some cases, the stages receive the same analog output. In some cases, the stages receive different analog inputs. For instance, some MASH ADCs have a front-end and a back-end where inputs to each modulator differ. Some MASH ADCs have stages where the implementation of the stage may differ. MASH ADCs address the issue of unstability by relying on the cascading of individually stable delta-sigma modulators. However, MASH ADCs rely on the cancellation of quantization noise, which requires accurate matching between analog and digital transfer functions.

Generally speaking, MASH ADCs can include a plurality of stages (cascaded delta sigma modulators) for digitizing the signal and errors of the system in order to meet design requirements related to bandwidth, resolution, and the signal to noise ratios. One advantage of MASH ADCs is that the design cascades stable low-order loops while achieving the good performance of (potentially unstable) higher-order loops. In one example, the first stage generates, from the analog input signal, a digital output signal using a first ADC. The input to the quantizer in the first stage (or equivalently, the output from the first loop filter/integrator) can be subtracted from the first DAC analog output to yield the first stage quantization noise. The first stage quantization noise is digitized by the second stage. The result is that the first stage generates an analog signal representing its quantization noise, and the second stage quantizes the quantization noise of the first stage using a second ADC. The multi-stage approach allows the quantization noise to be reduced and thus allows the MASH ADC to achieve higher performance. If more stages are used, the input to the quantizer in the second stage (or equivalently, the output from the second loop filter or integrator) can be subtracted from the second DAC analog output to yield the second stage quantization noise which can be in turn quantized by a third stage. Input to the quantizer or output from the loop filter/integrator may be delayed by a delay element prior to the subtraction. The delay element can be provided match possible transconductance and group delay of a signal path used for generating the DAC analog output from the analog signal at the input of the delay element. To generate the final output of the MASH ADC, the respective outputs are combined. Effectively, the result is that the quantization noise of the first stage is suppressed by the second stage, and the quantization noise from the second stage is suppressed by the third stage (yielding the same suppression of noise as a single third-order loop, when three cascaded first-order loops are used).

The feedback digital-to-analog converter (e.g., DAC 106 of FIG. 1) is, in some cases, not ideal. Although the DS ADC, in particular, the loop filter, is able to shape the noise from the quantizer 104, the DS ADC does not correct for nor shape the error e from the feedback DAC 106. As a result, the error e from DAC 106 shows up at the digital output v. In other words, without further modifications to the DS ADC, the DS ADC may require the feedback DAC to be as good as the overall DS ADC. This same issue is present for MASH ADCs, and even pipeline modulators. For instance, a MASH ADC sometimes has challenges in adequately correcting errors from the feedback DAC in the DS ADC at any of the stages.

In a continuous-time MASH ADC (MASH ADC implemented using continuous time circuitry), the analog input is converted to a sequence of digital code that approximates the spectrum of the input closely in a narrow band, while the quantization error is shaped away. To achieve better Signal-to-Quantization-Noise Ratio (SQNR), a multi-bit continuous-time delta sigma modulator is used due to its smaller quantization step and feasibility of higher out of band gain. Unfortunately the usage of multi-bit quantizer also requires a multi-bit DAC in the feedback path. The feedback DAC nonlinearities, i.e., represented by the error e seen in FIG. 1, add directly to the input signal and are not noise-shaped. Therefore, the feedback DAC nonlinearity needs to be as good as the resolution of the modulator itself. For this reason, one of the critical goals in the design of multi-bit delta-sigma ADCs is to reduce the impact that the limited linearity in the main feedback DAC has on the overall ADC performance (i.e., to correct or alleviate issues caused by the error introduced by the main feedback DAC). In other words, the errors in the feedback DAC may need to be measured and calibrated to ensure sufficient linearity and performance of the MASH ADC.

Figure 2:
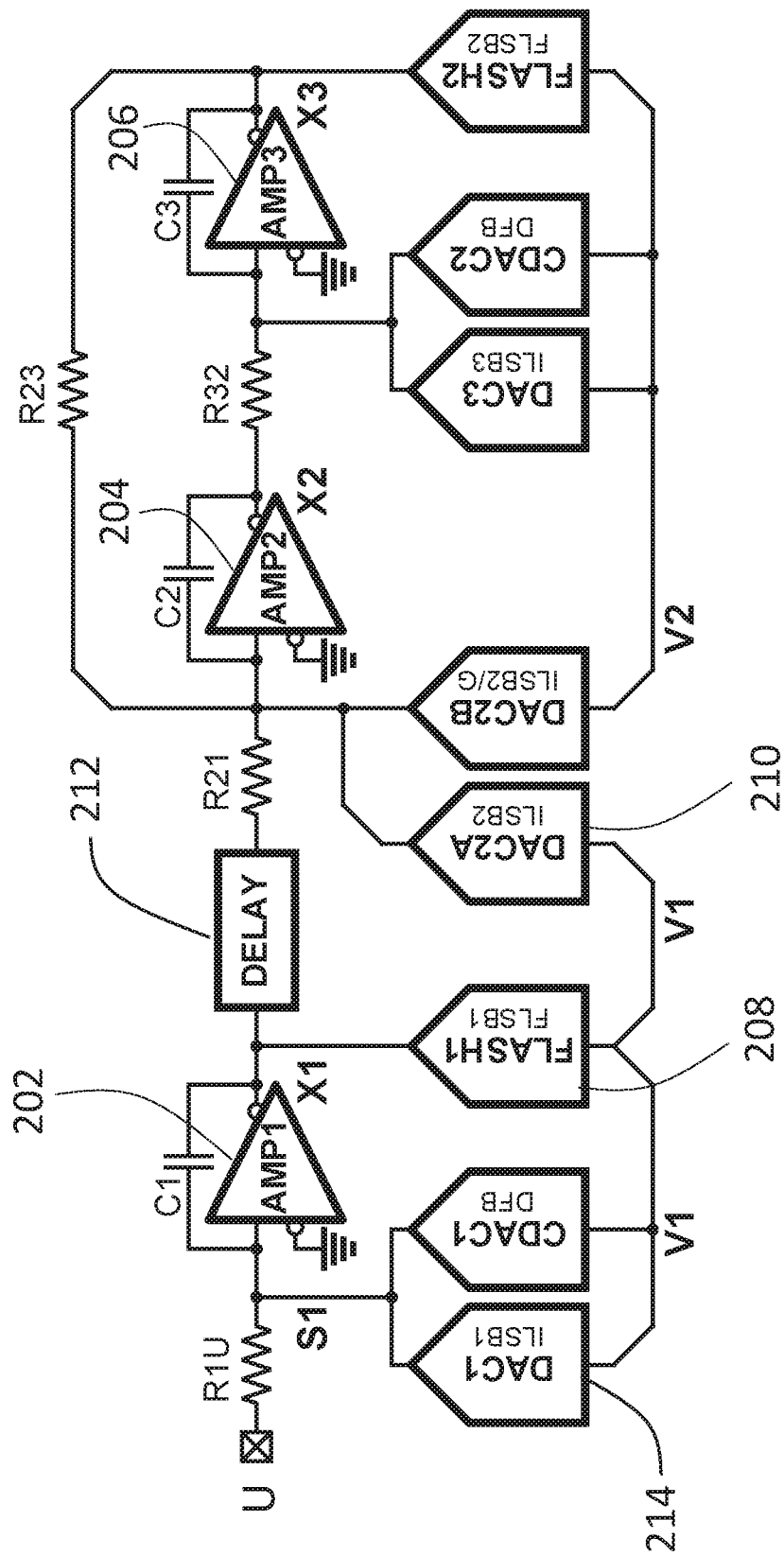
FIG. 2 is an illustrative system diagram of a 1-2 continuous time multi-stage delta sigma analog-to-digital converter (CT MASH ADC), according to some embodiments of the disclosure.

FIG. 2 is an illustrative system diagram of a 1-2 continuous time multi-stage delta sigma analog-to-digital converter (CT MASH ADC), according to some embodiments of the disclosure. In this example, the CT MASH ADC has two stages: a first order delta sigma modulator as the first stage (or front end), and a second order delta sigma modulator as the second stage (or back end). The first stage (or front end) generates a first digital output V1. The second stage (or back end) generates a second digital output V2. The order of the delta sigma modulator is determined by the number of integrators (number of feedback loops) in the stage. The first stage (front end) has only one integrator (e.g., integrator having opamp AMP1 202 generating output signal X1), thus it is a first order modulator. The second stage (back end) has two integrators (e.g., integrator having amplifier opamp AMP2 204 generating output X2, and integrator having opamp AMP3 206 generating output X3), thus it is a second order modulator. While this example is a 1-2 CT MASH ADC, the present disclosure is applicable to a variety of converters having the feedback DAC, including other CT MASH ADC architectures, discrete time (DT) MASH ADC architectures, hybrid CT-DT MASH ADC architectures, and CT, DT, or hybrid CT-DT pipeline modulators, successive approximation register (SAR) ADC architectures, and other ADC architectures having a feedback DAC whose errors affect the overall performance of the converter.

Referring back to FIG. 2, the residue of the coarse quantization provided by the flash quantizer ("FLASH1" 208) inside the first order front end is fed to the second order back end and gets digitized by the second order back end. The output of the integrator in the first order front end (or input to the flash quantizer FLASH1 208), X1, is digitized by FLASH1 208 to generate digital output V1. Digital output V1 is provided as input to DAC "DAC2A" 210 to generate an analog output signal. The difference between X1 (or a delayed version of X1 at the output of the delay block 212) and the DAC2A 210 analog output yields the residue of the coarse quantization. The delay element 212 can be provided match possible transconductance and group delay of a signal path used for generating the DAC2A 210 analog output, i.e., the path through FLASH1 208 and DAC2A 210. The digital output of the front end V1 and the digital output of the back end V2 are properly combined in digital domain as the final digital word of the 1-2 CT MASH ADC. The nonlinearity of the feedback DAC(s), i.e. static mismatch, timing mismatch error (sometimes referred to as timing error) and switching mismatch error (sometimes called or duty cycle error), will introduce harmonic distortions in the modulator. In particular, the performance of the feedback DAC "DAC1" 214 in FIG. 2 inside the first stage (the front end) is critical to the performance of the entire MASH ADC. Careful and deliberate analog circuit design and planning can improve the performance of the feedback DAC1, but in practice, the feedback DAC1 214 would still have some error.

Understanding Switching Mismatch Error of the Feedback DAC

Figure 3B:
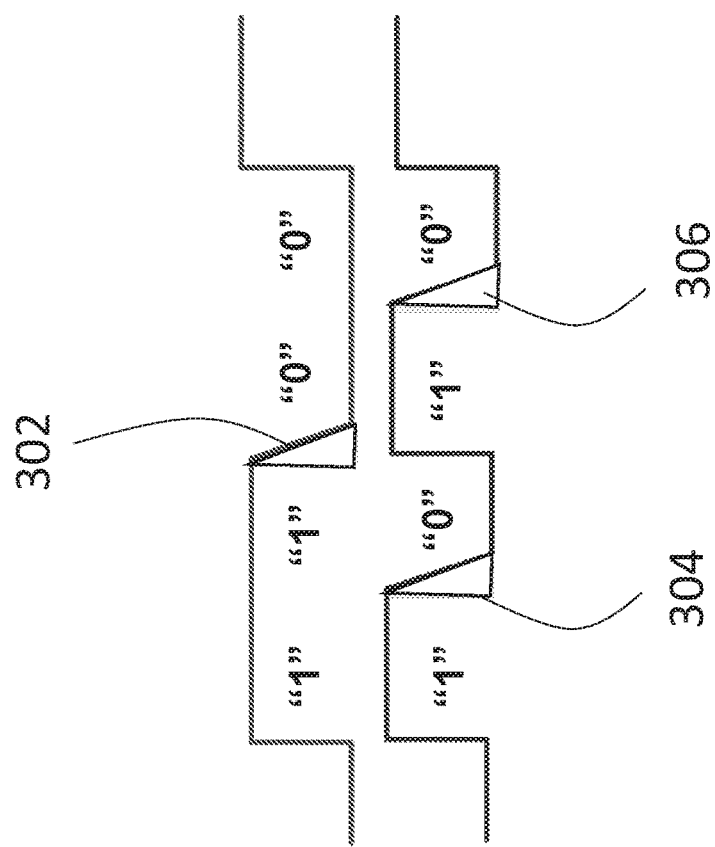
FIG. 3B illustrates error charges e(t) delivered due to the switching mismatch error, according to some embodiments of the disclosure.
Figure 3A:
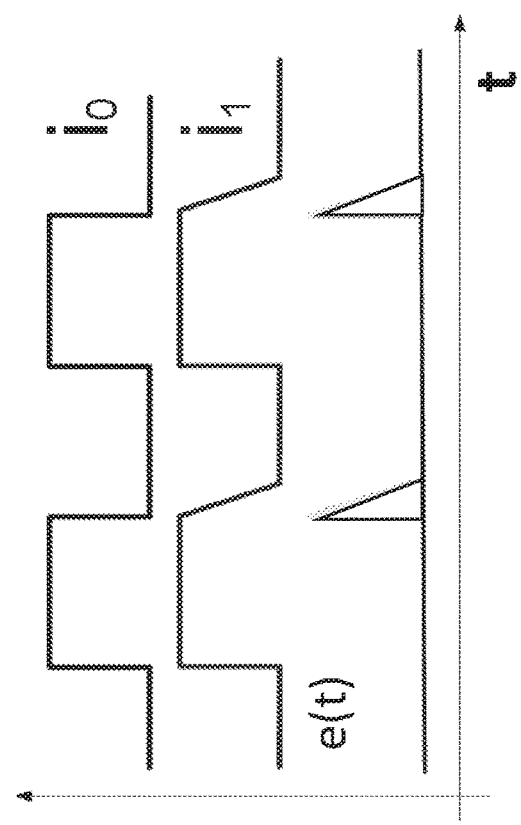
FIG. 3A shows current output of two DAC elements showing switching edge difference and delivered error charges e(t), according to some embodiments of the disclosure.

Switching mismatch error is caused by the rising/falling edge difference among DAC elements when a DAC element switches. FIG. 3A shows current output of two DAC elements, $i_0$ and $i_1$, showing switching edge difference and delivered error charges e(t), according to some embodiments of the disclosure. The switching edge differences between DAC elements are caused mainly by clock path mismatches and asymmetries, as well as the threshold voltage mismatch of the switching core metal-oxide semiconductor field-effect transistors (MOSFETs). Note that the delivered error charges e(t) is the same for each "1"→"0" switching occurrence. However, the error charges are code dependent. FIG. 3B illustrates error charges e(t) delivered due to the switching mismatch error, according to some embodiments of the disclosure. "1100" and "1010" codes ideally should deliver the same charge, but because of switching mismatch error, "1100" and "1010" codes delivers different amount of charges. For instance, "1100" delivers error charge represented by area in 302, and "1010" delivers error charge represented by areas 304 and 306. Due to the signal dependence of the switching error charges, the Signal-to-Noise-and-Distortion Ratio (SNDR) and spurious free dynamic range (SFDR) performances of the modulator are greatly deteriorated. The switching mismatch among elements becomes more significant for, e.g., high speed high bandwidth continuous-time delta sigma modulators, since there are more switching activities when the signal gets faster. Therefore, for high speed multi-bit continuous-time delta sigma modulator, the correction of the switching mismatch error among the DAC elements to achieve high linearity is one of the most critical design issues.

DAC Element Switching Mismatch Error Measurement and Calibration Mechanism

Figure 4:
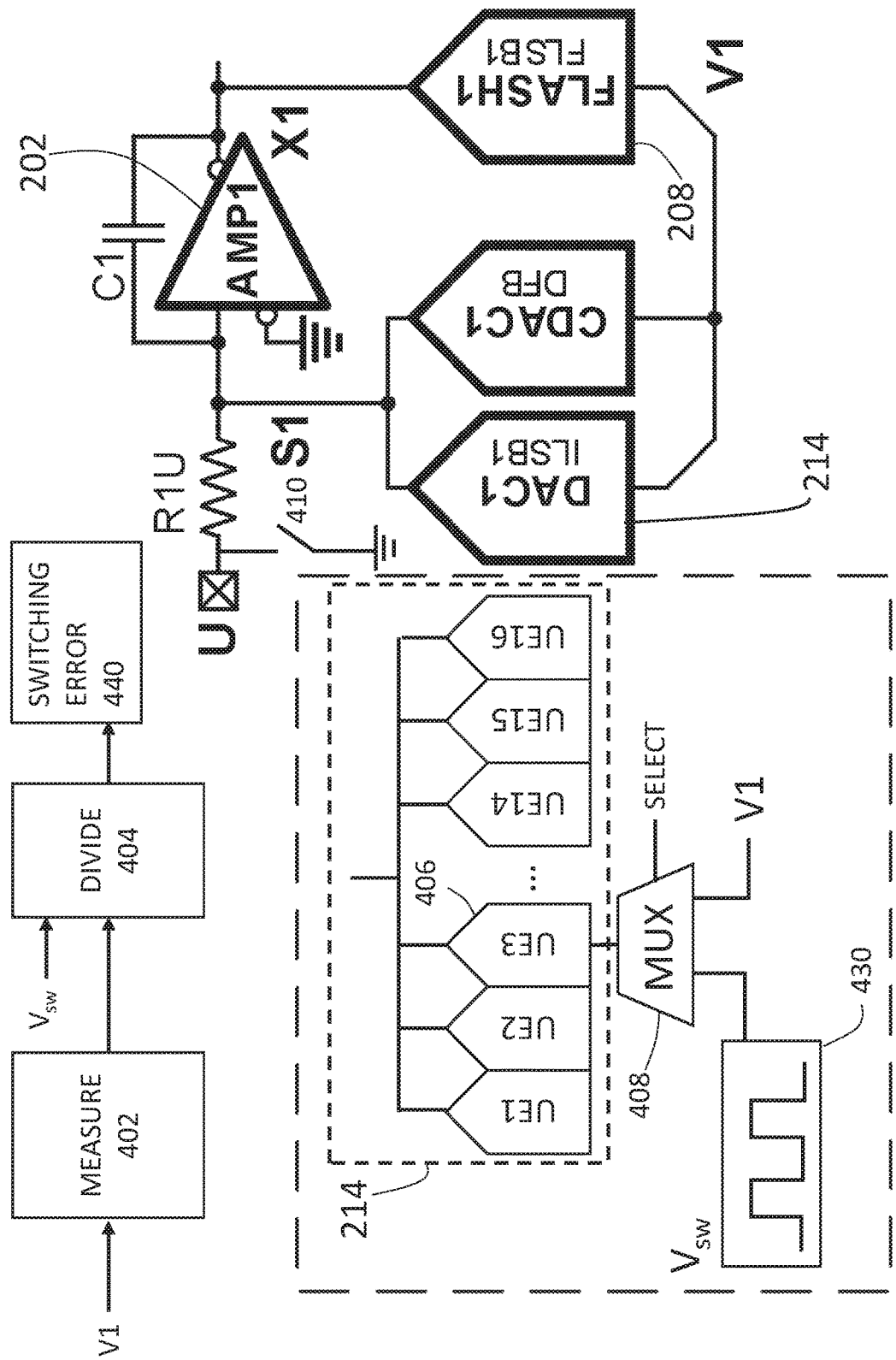
FIG. 4 shows a block diagram of the switching mismatch error measurement scheme, according to some embodiments of the disclosure.

FIG. 4 shows a block diagram of the switching mismatch error measurement scheme, according to some embodiments of the disclosure. As an example, FIG. 4 shows a continuous-time multi-bit delta sigma modulator following the architecture illustrated in FIG. 1, and this CT multi-bit DS modulator can be a front end or first stage in the multi-stage ADC seen in FIG. 2. The modulator has an integrator having opamp "AMP1" 202 integrating the signal at node S1 and generating output signal X1. X1 is provided to flash quantizer "FLASH1" 208 to be digitized. The modulator has a digital output signal V1 at the output of FLASH1 208. The continuous-time multi-bit delta sigma modulator has a multi-bit DAC1 in the feedback loop (shown as feedback DAC "DAC1" 214). The CT multi-bit DS modulator has a multi-bit DAC1 in the feedback loop (shown as feedback DAC "DAC1" 214). The input to feedback DAC "DAC1" 214 receives the digital output V1, and the output of the feedback DAC DAC1 214 is coupled or fed back to the analog input of the modulator (node S1). The multi-bit DS modulator can be standalone ADC, a part of a MASH ADC, or a part of a multi-stage ADC. This example is not meant to be limited to a CT multi-bit DS modulator, but is meant to illustrate how to measure the switching mismatch error of a feedback DAC in a variety of ADC architectures with a feedback loop configuration. A capacitor DAC "CDAC1" is provided to stabilize the feedback loop, and is not pertinent to the schemes described herein.

The quantizer "FLASH1" 208 output V1 can be thermometer coded, and the feedback DAC "DAC1" 214 can be a unit-element based where all the DAC elements (unit elements) in the feedback DAC have (ideally) the same weight. The "bits" or "parts" of the thermometer coded output V1 can control respective unit elements in the feedback DAC "DAC1" 214. In this example, as seen in the FIGURE, a 17-level mid-tread DAC using 16 elements (labeled as UE1, UE2, UE3 . . . UE14, UE15 and UE16) is depicted for feedback DAC "DAC1" 214. Other DAC architectures where switching mismatch errors are present are envisioned by the disclosure. Based on a corresponding "bit" or "part" in the digital input V1, a DAC element, in this case, a complementary DAC element, provides a feedback current of either $+I_{LSB}$ or $-I_{LSB}$ at the output 51 (in a fashion similar the DAC elements 302 and 304 in FIG. 3A). Herein, the DAC element is treated dimensionless, and its nominal value is either +1 or −1. In this example, the full scale output range of the feedback DAC is from −16 to +16 with least significant bit LSB of +2. In an ideal modulator with shorted input, each one of the DAC elements, UE1 to UE8, will be −1 (this is referred herein as the "default value", and +1 would be UE1 to UE8's complementary value), and each one of the DAC elements, UE9 to UE16, will be +1 (this is referred herein as the "default value" and −1 would be UE9 to UE16's complementary value), therefore the sum of all the DAC elements are 0, which equals to the (shorted) input. Different combination of +1's and −1's generated by the DAC elements, as dictated by the digital output V1, allows a variable output to be generated by the DAC and said variable output is fed back to node S1.

The switching error for a particular DAC element (DAC element under test) is measured by applying a square wave $V_{sw}$ at a fixed frequency $f_{sw}$ to the particular DAC element, and measuring the modulator output code V1, with the input of the modulator shorted. In the example shown, unit element UE3 506 is the DAC element under test whose switching mismatch error is to be measured. As illustrated in FIG. 4, a multiplexer 408 at the input of DAC1 (shown as "MUX") can select either the square wave signal $V_{SW}$ or the corresponding flash output V1 being applied to the particular DAC element. For example, when calibrating UE3, the input of UE3 is multiplexed to $V_{sw}$ while the rest 15 elements are connected to their corresponding flash outputs. A multiplexer can be provided for each DAC element whose switching mismatch error is to be measured. The unit element, similar to the current steering DAC elements seen in FIG. 3A, can generate an output of +1 or −1, depending on the logic level of the square wave signal.

The input can be shorted to ground=0 (zero potential) by controlling a switch 410, e.g., using a control signal, to couple the input node U to ground (closing switch "G" to short the input to the ADC to ground), or performing equivalent step(s) to provide a zero voltage potential signal as the input to the modulator. The element under test is outputting +1 or −1 depending on the logic level of the pseudo-random signal. Shorting the input to ground forces the rest of the elements not under test to react to the square wave signal toggling of the element under test, making sure all the elements sum to zero, since the loop ensures that the output of the quantizer V1 to follow the input U. Viewed differently, the rest of the DAC elements not under test (whose input is tied to receive the output of the quantizer V1) are being used to measure the switching mismatch error of the DAC element under test.

Note that the delta-sigma modulator itself, i.e., the feedback loop, is used to measure the switching mismatch error for the particular DAC element. The square wave signal can represent a sequence of alternating logic levels of, e.g., 1's and 0's. The assumption is that information associated with any switching mismatch error of the element under test would appear at the output of the feedback DAC at node S1 as the element under test is being actuated by the square wave signal. Due to the feedback loop configuration, the delta-sigma modulator can digitize the output of the feedback DAC 214, which means that the switching mismatch error would appear at the digital output of the modulator V1. The square wave signal and the digital output V1 would help reveal the information associated with any switching mismatch error of any DAC element under test.

As illustrated in FIG. 4, a selector, such as multiplexer 408 (shown as "MUX"), can select either a square wave $V_{sw}$ at a fixed frequency $f_{sw}$ or the corresponding bit in the flash output V1 being applied to the particular DAC element, e.g., in response to a "SELECT" signal. The "SELECT" signal can put the feedback DAC, or more specifically, the DAC element under test, to be in a calibration mode. For example, when calibrating the DAC element "UE3" 406, the input of UE3 406 is multiplexed to receive the square wave $V_{sw}$ at a fixed frequency $f_{sw}$ while the rest of the elements (e.g., 15 elements of the total of 16 elements) are connected to their corresponding bits in the flash output V1. A multiplexer such as multiplexer 408 or other suitable selection means can be provided for each DAC element whose switching mismatch error is to be measured. In some embodiments, the selection means can include selection circuitry for applying either the square wave $V_{sw}$ at a fixed frequency $f_{sw}$ or a corresponding part or bit of the digital output of the ADC (e.g., V1) to the input of the element under test (e.g., UE3 406).

If one DAC element switches even number of times, the dynamic switching error accumulates as a static DC (direct current) error to the modulator input, which is in turn digitized by the modulator itself to generate the modulator output V1. In other words, the modulator itself measures the switching error. The switching error can be readily obtained by observing the modulator output V1. For an ideal DAC element that switches even number of times, the DC output average is 0. However, due to the switching error, with each, e.g., "1" to "0" switching transition, a finite amount of error charge is added to the modulator loop. If the same element keep switching, the same amount of charge is injected every time (every "1" to "0" switching transition) and accumulate as a DC error that can be measured by the modulator itself. If the calibration scheme knows how many switching transition (e.g., number of "1" to "0" switching transitions) occurs, the error charge during each transition can then be calculated.

A square wave generator 430 can be included to generate the fixed frequency square wave $V_{SW}$. In one example, a (fixed frequency) square wave $V_{sw}$ with $f_{sw}=Fs/4$ (frequency of the square wave being sampling frequency divided by four) is applied to each DAC element sequentially. When the modulator input is shorted, due to circuit noise and loop non-ideality, the middle DAC elements UE7, UE8, UE9, and UE10 are generally toggling between +1 and −1, while DAC elements, UE1, UE2, UE3, UE4, UE5, and UE6, output a fixed value −1 and DAC elements, UE11, UE12, UE13, UE14, UE15, and UE16, output a fixed value of +1. Because DAC elements, UE7, UE8, UE9, and UE10, are toggling, they may be "fixed" when measuring their switching errors. When measuring switching error of the toggling DAC elements, e.g, UE7, UE8, UE9, and UE10, DAC elements UE1, UE2, UE3, UE4 may be forced to output their complementary value of +1 (versus the default value of −1), therefore the toggling elements are shifted to from DAC elements, UE7, UE8, UE9, and UE10, to DAC elements, UE11, UE12, UE13, UE14, and the switching errors of the previously toggling DAC elements, UE7, UE8, UE9, and UE10, can be measured.

A measurement block 402 can be included to make measurement(s) of the modulator output when the fixed frequency square wave $V_{SW}$ is driving the DAC element under test. Making measurements can include accumulating (or summing) the values of the modulator output V1 while the DAC element under test is being driven by the fixed frequency square wave. Dedicated hardware may be implemented in the measurement block 402 to perform the accumulation. In some cases, a buffer can be provided to store values/samples of the modulator output V1, and an on-chip processor can be execute instructions to process the values in the buffer to derive measurements of the modulator.

The divide block 404 can take the fixed frequency square wave $V_{SW}$ as input (or an input which indicates the number of transitions the fixed frequency square wave $V_{SW}$ forces the DAC element under test to go through) and the measurement(s) made by measurement block 402 to extract the DC value being accumulated in the measurement(s). The DC value represents an accumulated switching mismatch error of the DAC element under test. Specifically, the switching mismatch error or charge introduced by the DAC element under test is accumulated over the many times the fixed frequency square wave forces the DAC element to switch (i.e., transitions). Accordingly, the divide block 404 can take the extracted DC value and divide it over the number of times/transitions to determine the switching error of the DAC element under test. Note that the number of times/transitions is a period of time the fixed frequency square wave is applied to the input of the element under test times or multiplied by the frequency of the fixed frequency square wave.

Figure 5:
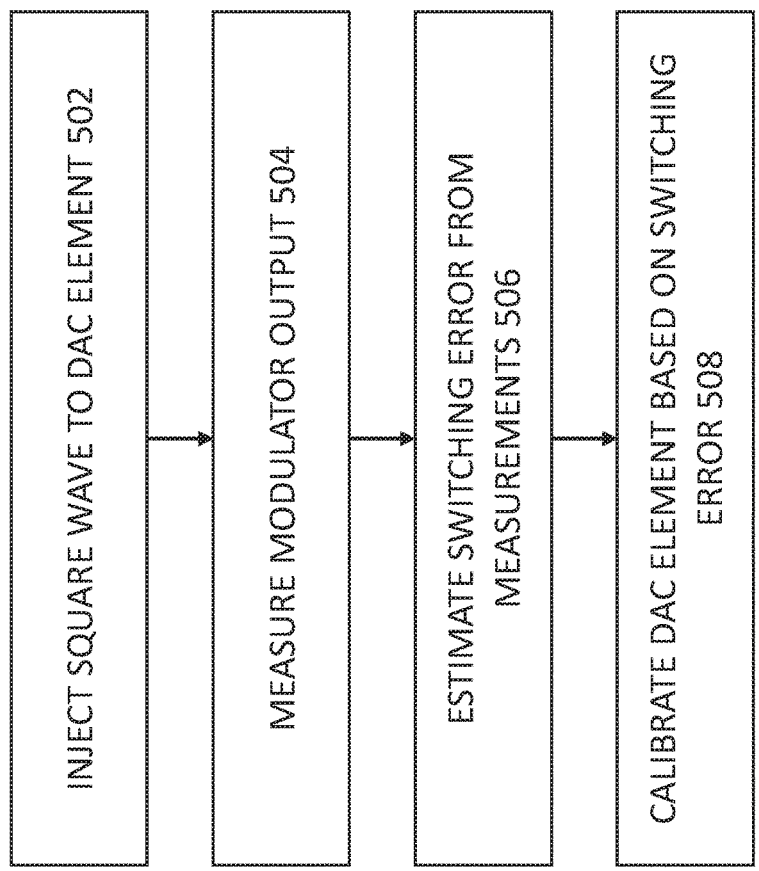
FIG. 5 is a flow diagram illustrating a method for digitally estimating and calibrating switching mismatch error of a DAC element, according to some embodiments of the disclosure.

Method for Measuring and Calibrating the Switching Mismatch Error of the DAC Element FIG. 5 is a flow diagram illustrating a method for digitally estimating and calibrating switching mismatch error of a DAC element, according to some embodiments of the disclosure. The method outlined is described for a particular DAC element. It is envisioned by the disclosure that the same method can be applied to other DAC elements in the multi-bit feedback DAC to measure the switching mismatch error of the rest of the DAC elements.

In 502, a square wave signal is injected or applied to an input of the particular DAC element (DAC element under test) of a feedback DAC, e.g., in a delta-sigma modulator. The feedback DAC has an output which is coupled to an analog input of an ADC having a feedback loop configuration and an input which is coupled to a digital output of the ADC. A multiplexer can be used to select the square wave signal (versus the regular flash output corresponding to the DAC element under test). When the square wave signal is applied, the input to the ADC is shorted to ground. The rest of the DAC elements not under test can have the corresponding flash outputs as its input. In other words, while fixed frequency square wave signal is applied to the input of the element under test, the digital output of the ADC is applied to other elements of the feedback DAC. The feedback loop configuration allows the modulator itself to measure the switching error of the DAC element. In some embodiments, if the DAC element under test is a toggling unit element, some other DAC element(s) may be forced to output its complementary value (as opposed to the default value) so that the DAC element under test is no longer toggling or does not toggle when the switching mismatch error is being measured.

In 504, the modulator output is measured. For instance, values/samples of the modulator output can be accumulated or summed over a period of time when the fixed frequency square wave is applied to the DAC element under test. The summed or accumulated samples reveal a DC error that is injected when the DAC element under test injected by the transitions triggered by the fixed frequency square wave.

In 506, the switching mismatch error is estimated based on the measurements of the modulator output (e.g., the accumulation or the sum), e.g., based on the fixed frequency square wave and the digital output of the ADC. For instance, a DC error can be extracted from the measurements and the DC error can be divided by the number of transitions causing the switching mismatch error to be injected and accumulated as the DC error. For example, the measuring of the switching mismatch error comprises dividing a sum of samples of the digital output of the ADC by a number of transitions. The number of transitions is a frequency of the fixed frequency square wave multiplied by a period of time the fixed frequency square wave is applied to the input of the element under test.

In 506, the DAC element under test can be calibrated based on the switching mismatch error. In some embodiments, a capacitor array can be tied to the switches in the DAC element to make/drive the "1"→"0" and "0"→"1" edges (as seen in FIG. 3B) to be equal so that the accumulated switching mismatch error is zero. In some embodiments, the threshold voltage of the switches (transistors) in the DAC element can be tuned to drive the accumulated switching mismatch error to zero.

Operations in the method shown in FIG. 5 can be repeated for other elements under test of the feedback DAC. Note that the scheme does not require an additional DAC element to be provided in the feedback DAC for measurement/calibration. Furthermore, the scheme can be operated in the foreground when the converter is not in normal operation or during conversion.

Exemplary Apparatus Having Analog to Digital Conversion and Switching Mismatch Error Estimation for the Feedback ADC In some embodiments, the apparatus includes a quantizer for digitizing an analog input and generating a digital output, and a feedback DAC (DAC) receiving the digital output as input and providing a feedback signal to the analog input. The apparatus can be a continuous-time delta-sigma modulator in a multi-stage delta sigma analog-to-digital converter (e.g., seen in FIG. 2), but the apparatus can be other ADCs having a feedback DAC. The switching mismatch error estimation scheme is particularly beneficial to ADCs where the errors from the feedback DAC needs to be reduced (or that the errors cannot be shaped away).

The apparatus includes means for applying a fixed frequency square wave signal to a DAC element under test of the feedback DAC while rest of the DAC elements of the feedback DAC receives the digital output. The means can include the selection circuitry described herein, such as a multiplexer. The apparatus further includes means for measuring the digital output and means for determining switching mismatch error from the fixed frequency square wave signal and the digital output.

The means for determining switching mismatch error comprises means for determining a DC component in the digital output signal caused by transitions of the fixed frequency square wave signal. The means for determining switching mismatch can include means for determining the switching mismatch error from the DC component and a number of the transitions, the number of transitions being a frequency of the fixed frequency square wave multiplied by a period of time the fixed frequency square wave is applied to the input of the element under test.

In some cases, the DAC element under test may toggle due to loop non-idealities. In such cases, the feedback DAC can include means for forcing DAC element(s) to output a complementary value (as opposed to the default value) so that the element under test does not toggle when the switching error is being measured.

The apparatus can further include digital and/or analog means for calibrating (or correcting) the feedback DAC based on switching mismatch error.

The procedures for means for performing these functions are illustrated by, e.g., FIG. 4 and the accompanying description.

EXAMPLES

Example 1 is a method for measuring switching mismatch error, comprising: applying a fixed frequency square wave signal to an input of an element under test of a feedback digital to analog converter (DAC), wherein the feedback DAC has an output which is coupled to an analog input of an analog to digital converter (ADC) having a feedback loop configuration and an input which is coupled to a digital output of the ADC; and measuring a switching mismatch error of the element under test of feedback digital to analog converter based on the fixed frequency square wave and the digital output of the ADC.

In Example 2, Example 1 can include shorting the analog input to the ADC to ground.

In Example 3, any one of the above Examples can include the measuring of the switching mismatch error comprising accumulating samples of the digital output of the ADC.

In Example 4, any one of the above Examples can include: the measuring of the switching mismatch error comprising dividing a sum of samples of the digital output of the ADC by a number of transitions; and the number of transitions being a frequency of the fixed frequency square wave multiplied by a period of time the fixed frequency square wave is applied to the input of the element under test.

In Example 5, any one of the above Examples can include: while the fixed frequency square wave signal is applied to the input of the element under test, the digital output of the ADC being applied to other elements of the feedback DAC.

In Example 6, any one of the above Examples can include forcing one or more other elements of the feedback DAC to output a value, wherein the value is selected such that the element under test does not toggle when the switching mismatch error is being measured.

In Example A, any one of the above Examples can include repeating the applying and the measuring for another element under test of the feedback DAC.

Example 7 is a circuit for measuring switching mismatch, comprising: a measurement block for accumulating samples of a digital output of an analog to digital converter (ADC) having a feedback digital to analog converter (DAC) when a fixed frequency square wave is driving an input of an element in the feedback DAC; and a divide block for determining switching mismatch error based on accumulated samples of the digital output and a number of transitions introduced to the input of the element under test by the fixed frequency square wave.

In Example 8, any one of the above Examples can include the number of transitions being a frequency of the fixed frequency square wave multiplied by a period of time the fixed frequency square wave is applied to the input of the element under test.

In Example 9, any one of the above Examples can include a buffer for storing samples of the digital output of the ADC collected when (or samples collected while) the pseudo random dither signal is applied to the input of the element under test.

In Example 10, any one of the above Examples can include selection circuitry for applying either the fixed frequency square wave signal or a corresponding part of the digital output of the ADC to the input of the element under test.

In Example 11, any one of the above Examples can include a switch for shorting an analog input to the ADC to ground.

In Example 12, any one of the above Examples can include a square wave generator for generating the fixed frequency square wave.

In Example 13, any one of the above Examples can include the fixed frequency square wave having a frequency of a sampling frequency of the feedback DAC divided by four.

In Example 14, any one of the above Examples can include the feedback DAC comprising DAC element(s) which are forced to output a value (e.g., a complementary value), wherein the value is selected such that the element under test does not toggle when the switching error is being measured.

Example 15 is an apparatus comprising: a quantizer for digitizing an analog input and generating a digital output; a feedback digital to analog converter (DAC) receiving the digital output as input and providing a feedback signal to the analog input; means for applying a fixed frequency square wave signal to a DAC element under test of the feedback DAC while a remainder of the DAC elements of the feedback DAC receives the digital output; means for measuring the digital output; and means for determining switching mismatch error from the fixed frequency square wave signal and the digital output.

In Example 16, any one of the above Examples can include the feedback DAC comprising means for forcing DAC element(s) to output a value, wherein the value is selected such that the element under test does not toggle when the switching error is being measured.

In Example 17, any one of the above Examples can include means for determining switching mismatch error comprising means for determining a DC component in the digital output signal caused by transitions of the fixed frequency square wave signal when the fixed frequency square wave signal is being applied.

In Example 18, any one of the above Examples can include means for determining switching mismatch error comprising means for determining the switching mismatch error based on the DC component and a number of the transitions, the number of transitions being a frequency of the fixed frequency square wave multiplied by a period of time the fixed frequency square wave is applied to the input of the element under test.

In Example 19, any one of the above Examples can include the apparatus being a pipeline analog-to-digital converter.

In Example 20, any one of the above Examples can include the apparatus being a continuous-time delta-sigma modulator in a multi-stage delta sigma analog-to-digital converter.

Other Implementation Notes, Variations, and Applications

The width of radio frequency (RF) bands commonly used for cellular telecommunications has grown from 35-75 MHz for 2G/3G/4G platforms to 100-200 MHz for today's Long Term Evolution (LTE) and the desire for relaxed image rejection filtering has pushed the direct intermediate frequency (IF) sampling frequencies to 300+MHz. In some embodiments, the scheme for measuring and calibrating for switching mismatch error can be used in a continuous-time (CT) multi-stage noise-shaping (MASH) ADC integrated circuit which achieves 69 dB of DR over a 465 MHz signal bandwidth with a combined power consumption of 930 mW from ±1.0V/1.8V supplies. The ADC integrated circuit can be implemented in 28 nm CMOS and achieves a peak SNDR of 64 dB, a small-signal noise-spectral density (NSD) of −156 dBFS/Hz, and a figure-of-merit (FOM) of 156 dB over a signal bandwidth of 465 MHz. With an 8 GHz sample rate and a signal bandwidth of 465 MHz, the oversampling ratio (OSR) is 8.6. A 1-2 MASH architecture can be chosen to achieve aggressive noise-shaping at a low OSR. The use of low-order sub-loops also contributes to the robustness of the overall ADC. The first stage can be a first-order modulator to minimize the power of amplifiers for a given thermal noise requirement under a low OSR scenario. The first stage can include an active-RC integrator, a 17-level flash ADC (FLASH1), a current-steering DAC (IDAC1), and a capacitive-DAC (CDAC1). CDAC1 implements a fast direct-feedback (DFB) loop to compensate for the excess loop delay associated with the chosen FLASH-IDAC timing. A differential 200Ω R1U and a 625 uA IDAC1 LSB can set a 2V differential p-p input full-scale. A dither block adds a 1-bit 1/2-LSB dither signal to the output of FLASH1. The quantization residue of the first-stage is injected into the second-stage via R21 and current-steering DAC (IDAC2A). R21 is implemented as an all-pass RC lattice filter to provide both accurate transconductance and a group delay that approximately matches the delay through the FLASH1-IDAC2A path. The residue current is then digitized by the second-order second stage. The second stage consists of an active-RC resonator, a 17-level flash ADC (FLASH2), current steering DACs (IDAC2B and IDAC3), and a capacitive-DAC (CDAC2) used to provide a DFB loop. The second stage uses a feedback topology to minimize STF peaking and the input full-scale of the second stage is scaled down to provide an inter-stage gain of six to minimize the overall quantization noise floor while preventing the residue of the first stage from saturating the second stage. The digital outputs of both stages, V1 and V2, are fed to the digital backend for further processing.

For simplicity, FIGS. 3A-3B shows that the "0"→"1" edge as being ideal, while "1"→"0" shows a non-ideal edge (delivering the error charge represented by areas 302, 304, and 306). One skilled in the art would appreciate that in some cases both "0"→"1" edge and "1"→"0" edge are non-ideal, or "1"→"0" is an ideal edge while "0"→"1" is the non-ideal edge. Various mechanisms described herein for switching mismatch error measurement and calibration are also applicable to those cases.

While the embodiments described herein are described in relation to a delta sigma modulator having a feedback DAC, the method for measuring switching mismatch error of DAC elements can also be applied to other architectures, such as a feedback DAC inside pipeline ADC, a feedback DAC inside a successive-approximation register ADC, a feedback DAC in a continuous-time pipeline ADC. For a delta sigma modulator, the switching error from the unit element of under test in the feedback DAC can be measured using the other unit elements of the feedback DAC, since the other unit elements are readily available in the delta-sigma loop. For other types of ADC, such as the pipeline ADC, the switching error from the unit element under test of the feedback DAC of a given stage can be measured using the subsequent stages in the pipeline ADC in a similar fashion, and the switching error would appear in an output of the pipeline ADC.

The embodiments described herein can be applicable for correcting the feedback DAC switching mismatch errors in any one of the stages of a MASH ADC, including continuous-time MASH ADCs (which uses continuous-time circuits), discrete-time MASH ADCs (which uses switched-capacitor circuits), or a hybrid continuous-time and discrete-time MASH ADC. In some cases, the switching mismatch error of the DAC element measurement scheme can also be applied to stand-alone high speed DACs. Results show that the embodiments described herein can be an attractive calibration technique for high speed high performance low-pass as well as band-pass continuous-time delta sigma modulators, especially for high speed systems in the multi-GHz range with low over-sampling rate (OSR), where dynamic errors from the feedback DAC becomes more critical.

In one example embodiment, any number of electrical circuits of the FIGURES may be implemented on a board of an associated electronic device. The board can be a general circuit board that can hold various components of the internal electronic system of the electronic device and, further, provide connectors for other peripherals. More specifically, the board can provide the electrical connections by which the other components of the system can communicate electrically. Any suitable processors (inclusive of digital signal processors, microprocessors, supporting chipsets, etc.), computer-readable non-transitory memory elements, etc. can be suitably coupled to the board based on particular configuration needs, processing demands, computer designs, etc. Other components such as external storage, additional sensors, controllers for audio/video display, and peripheral devices may be attached to the board as plug-in cards, via cables, or integrated into the board itself. In various embodiments, the functionalities described herein may be implemented in emulation form as software or firmware running within one or more configurable (e.g., programmable) elements arranged in a structure that supports these functions. The software or firmware providing the emulation may be provided on non-transitory computer-readable storage medium comprising instructions to allow a processor to carry out those functionalities.

In another example embodiment, the electrical circuits of the FIGURES may be implemented as stand-alone modules (e.g., a device with associated components and circuitry configured to perform a specific application or function) or implemented as plug-in modules into application specific hardware of electronic devices. Note that particular embodiments of the present disclosure may be readily included in a system on chip (SOC) package, either in part, or in whole. An SOC represents an IC that integrates components of a computer or other electronic system into a single chip. It may contain digital, analog, mixed-signal, and often radio frequency functions: all of which may be provided on a single chip substrate. Other embodiments may include a multi-chip-module (MCM), with a plurality of separate ICs located within a single electronic package and configured to interact closely with each other through the electronic package. In various other embodiments, the digital filters may be implemented in one or more silicon cores in Application Specific Integrated Circuits (ASICs), Field Programmable Gate Arrays (FPGAs), and other semiconductor chips.

It is also imperative to note that all of the specifications, dimensions, and relationships outlined herein (e.g., the number of processors, logic operations, etc.) have only been offered for purposes of example and teaching only. Such information may be varied considerably without departing from the spirit of the present disclosure, or the scope of the appended claims (if any) or the summary of features. The specifications apply only to one non-limiting example and, accordingly, they should be construed as such. In the foregoing description, example embodiments have been described with reference to particular processor and/or component arrangements. Various modifications and changes may be made to such embodiments without departing from the scope of the appended claims (if any) or the summary of features. The description and drawings are, accordingly, to be regarded in an illustrative rather than in a restrictive sense.

The present architecture for DAC switching mismatch error measurement and calibration are particularly suitable for high speed, continuous-time, high precision applications where MASH ADCs are used. Applications which can greatly benefit from the architecture include: instrumentation, testing, spectral analyzers, military purposes, radar, wired or wireless communications, mobile telephones (especially because standards continue to push for higher speed communications), and base stations.

Note that with the numerous examples provided herein, interaction may be described in terms of two, three, four, or more electrical components. However, this has been done for purposes of clarity and example only. It should be appreciated that the system can be consolidated in any suitable manner. Along similar design alternatives, any of the illustrated components, modules, and elements of the FIGURES may be combined in various possible configurations, all of which are clearly within the broad scope of this Specification. In certain cases, it may be easier to describe one or more of the functionalities of a given set of flows by only referencing a limited number of electrical elements. It should be appreciated that the electrical circuits of the FIGURES and its teachings are readily scalable and can accommodate a large number of components, as well as more complicated/sophisticated arrangements and configurations. Accordingly, the examples provided should not limit the scope or inhibit the broad teachings of the electrical circuits as potentially applied to a myriad of other architectures.

Note that in this Specification, references to various features (e.g., elements, structures, modules, components, steps, operations, characteristics, etc.) included in "one embodiment", "example embodiment", "an embodiment", "another embodiment", "some embodiments", "various embodiments", "other embodiments", "alternative embodiment", and the like are intended to mean that any such features are included in one or more embodiments of the present disclosure, but may or may not necessarily be combined in the same embodiments.

It is also important to note that the functions related DAC switching mismatch error measurement and calibration, such as the processes shown in FIG. 5, illustrate only some of the possible functions that may be executed by, or within, the system illustrated in FIG. 4. Some of these operations may be deleted or removed where appropriate, or these operations may be modified or changed considerably without departing from the scope of the present disclosure. In addition, the timing of these operations may be altered considerably. The preceding operational flows have been offered for purposes of example and discussion. Substantial flexibility is provided by embodiments described herein in that any suitable arrangements, chronologies, configurations, and timing mechanisms may be provided without departing from the teachings of the present disclosure.

Numerous other changes, substitutions, variations, alterations, and modifications may be ascertained to one skilled in the art and it is intended that the present disclosure encompass all such changes, substitutions, variations, alterations, and modifications as falling within the scope of the appended claims. Note that all optional features of the apparatus described above may also be implemented with respect to the method or process described herein and specifics in the examples may be used anywhere in one or more embodiments.

What is claimed is:

1. A method for measuring switching mismatch error, comprising:
    applying a fixed frequency square wave signal to an input of an element under test of a feedback digital to analog converter (DAC), wherein the feedback DAC has an output which is coupled to an analog input of an analog to digital converter (ADC) having a feedback loop configuration and an input which is coupled to a digital output of the ADC; and
    measuring a switching mismatch error of the element under test of feedback digital to analog converter based on the fixed frequency square wave and the digital output of the ADC.

2. The method of claim 1, further comprising:
    shorting the analog input to the ADC to ground.

3. The method of claim 1, wherein the measuring of the switching mismatch error comprises accumulating samples of the digital output of the ADC.

4. The method of claim 1, wherein:
    the measuring of the switching mismatch error comprises dividing a sum of samples of the digital output of the ADC by a number of transitions; and
    the number of transitions is a frequency of the fixed frequency square wave multiplied by a period of time the fixed frequency square wave is applied to the input of the element under test.

5. The method of claim 1, further comprising:
    while the fixed frequency square wave signal is applied to the input of the element under test, the digital output of the ADC is applied to other elements of the feedback DAC.

6. The method of claim 1, further comprising:
    forcing one or more other elements of the feedback DAC to output a value, wherein the value is selected such that the element under test does not toggle when the switching mismatch error is being measured.

7. A circuit for measuring switching mismatch, comprising:
    a measurement block for accumulating samples of a digital output of an analog to digital converter (ADC) having a feedback digital to analog converter (DAC) when a fixed frequency square wave is driving an input of an element in the feedback DAC; and
    a divide block for determining switching mismatch error based on accumulated samples of the digital output and a number of transitions introduced to the input of the element under test by the fixed frequency square wave.

8. The circuit of claim 7, wherein:
    the number of transitions is a frequency of the fixed frequency square wave multiplied by a period of time the fixed frequency square wave is applied to the input of the element under test.

9. The circuit of claim 7, further comprising:
a buffer for storing samples of the digital output of the ADC collected when the fixed frequency square wave is applied to the input of the element under test.

10. The circuit of claim 7, further comprising:
selection circuitry for applying either the fixed frequency square wave or a corresponding part of the digital output of the ADC to the input of the element under test.

11. The circuit of claim 7, further comprising:
a switch for shorting an analog input to the ADC to ground.

12. The circuit of claim 7, further comprising:
a square wave generator for generating the fixed frequency square wave.

13. The circuit of claim 7, wherein:
the fixed frequency square wave has a frequency of a sampling frequency of the feedback DAC divided by four.

14. The circuit of claim 7, wherein:
the feedback DAC comprises DAC element(s) which are forced to output a value, wherein the value is selected such that the element under test does not toggle when the switching mismatch error is being measured.

15. An apparatus comprising:
a quantizer for digitizing an analog input and generating a digital output;
a feedback digital to analog converter (DAC) receiving the digital output as input and providing a feedback signal to the analog input;
means for applying a fixed frequency square wave signal to a DAC element under test of the feedback DAC while a remainder of DAC elements of the feedback DAC receives the digital output;
means for measuring the digital output; and
means for determining switching mismatch error from the fixed frequency square wave signal and the digital output.

16. The apparatus of claim 15, wherein:
the feedback DAC comprises means for forcing DAC element(s) to output a value, wherein the value is selected such that the DAC element under test does not toggle when the switching mismatch error is being measured.

17. The apparatus of claim 15, wherein means for determining switching mismatch error comprises:
means for determining a DC component in the digital output caused by transitions of the fixed frequency square wave signal when the fixed frequency square wave signal is being applied.

18. The apparatus of claim 17, wherein means for determining switching mismatch error comprises:
means for determining the switching mismatch error based on the DC component and a number of the transitions, the number of transitions being a frequency of the fixed frequency square wave signal multiplied by a period of time the fixed frequency square wave signal is applied to the input of the DAC element under test.

19. The apparatus of claim 15, wherein the apparatus is a pipeline analog-to-digital converter.

20. The apparatus of claim 15, wherein the apparatus is a continuous-time delta-sigma modulator in a multi-stage delta sigma analog-to-digital converter.

* * * * *